(12) United States Patent
Manepalli et al.

(10) Patent No.: US 7,816,487 B2
(45) Date of Patent: Oct. 19, 2010

(54) DIE-ATTACH FILMS FOR CHIP-SCALE PACKAGING, PACKAGES MADE THEREWITH, AND METHODS OF ASSEMBLING SAME

(75) Inventors: Rahul N. Manepalli, Phoenix, AZ (US); Ravindra V. Tanikella, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 1742 days.

(21) Appl. No.: 10/956,624

(22) Filed: Sep. 30, 2004

(65) Prior Publication Data

US 2006/0073624 A1    Apr. 6, 2006

(51) Int. Cl.
  *H01L 21/56* (2006.01)
(52) U.S. Cl. .............. 528/422; 257/777; 257/783; 156/331.2; 156/331.1
(58) Field of Classification Search .......... 520/1; 257/777, E25.03, 783, E21.429; 156/331.2, 156/331.1; 528/422
See application file for complete search history.

(56) References Cited

U.S. PATENT DOCUMENTS

| | | | | |
|---|---|---|---|---|
| 4,902,732 | A * | 2/1990 | Itoh et al. ............... 523/433 |
| 5,530,036 | A * | 6/1996 | Sano et al. ............... 522/79 |
| 5,955,543 | A * | 9/1999 | Sachdev et al. ........... 525/118 |
| 6,294,259 | B1 * | 9/2001 | Anderson et al. .......... 428/413 |
| 6,538,093 | B2 * | 3/2003 | Sugo et al. ............... 528/28 |
| 6,620,512 | B2 | 9/2003 | Jayaraman et al. |
| 7,041,736 | B2 | 5/2006 | Jayaraman et al. |
| 7,202,304 | B2 | 4/2007 | Jayaraman et al. |
| 7,312,534 | B2 * | 12/2007 | delos Santos et al. ...... 257/783 |
| 2002/0140063 | A1 * | 10/2002 | Yamazaki et al. ......... 257/668 |
| 2002/0155244 | A1 * | 10/2002 | Sakurai et al. .......... 428/40.1 |
| 2003/0045669 | A1 * | 3/2003 | Tsuji et al. .............. 528/170 |
| 2003/0089516 | A1 * | 5/2003 | Hattori et al. ............. 174/66 |
| 2004/0091688 | A1 * | 5/2004 | Gaku et al. .............. 428/209 |
| 2005/0165196 | A1 * | 7/2005 | Kinoshita et al. .......... 528/28 |
| 2006/0147719 | A1 * | 7/2006 | Rubinsztajn et al. ....... 428/413 |
| 2006/0226525 | A1 * | 10/2006 | Osuga et al. ............. 257/685 |
| 2006/0228562 | A1 * | 10/2006 | Ukawa et al. ............ 428/413 |
| 2006/0252863 | A1 * | 11/2006 | Takeko et al. ............ 524/261 |
| 2007/0152314 | A1 * | 7/2007 | Manepalli et al. ......... 257/686 |

* cited by examiner

*Primary Examiner*—George Fourson
(74) *Attorney, Agent, or Firm*—John N. Greaves

(57) ABSTRACT

A die-attach composition includes a resin such as a thermosetting resin, a hardener, and a low molecular weight oligomer diluent. A die-attach composition includes a polyimide in a major amount and a resin such as a thermosetting resin in a minor amount. The die-attach composition also includes a reactive polymer diluent. Combinations of the low molecular weight oligomer diluent and the reactive polymer diluent are included. The die-attach composition is applied to surface mount technology such as wire-bond dice. A computing system is also included that uses the die-attach composition.

6 Claims, 5 Drawing Sheets

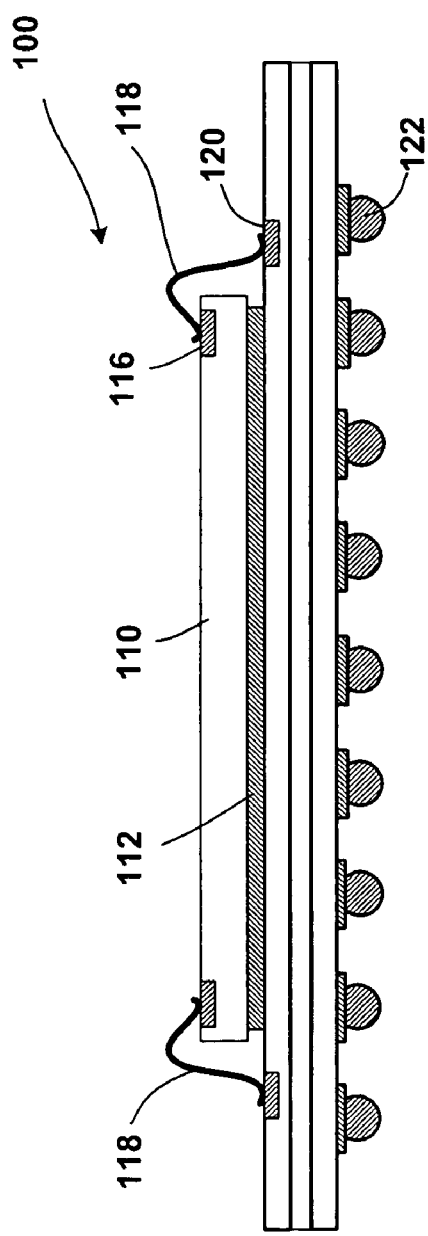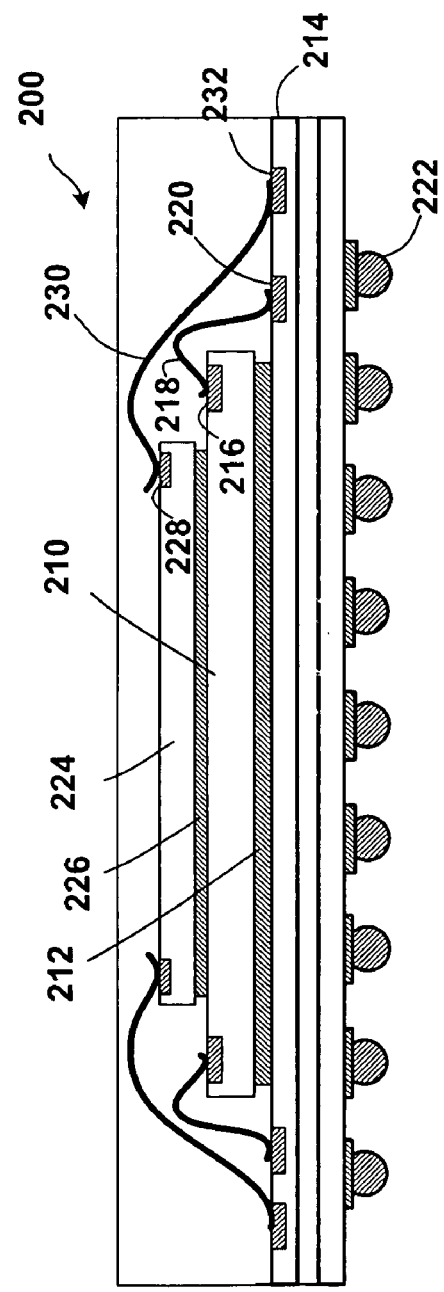
FIG. 1
FIG. 2

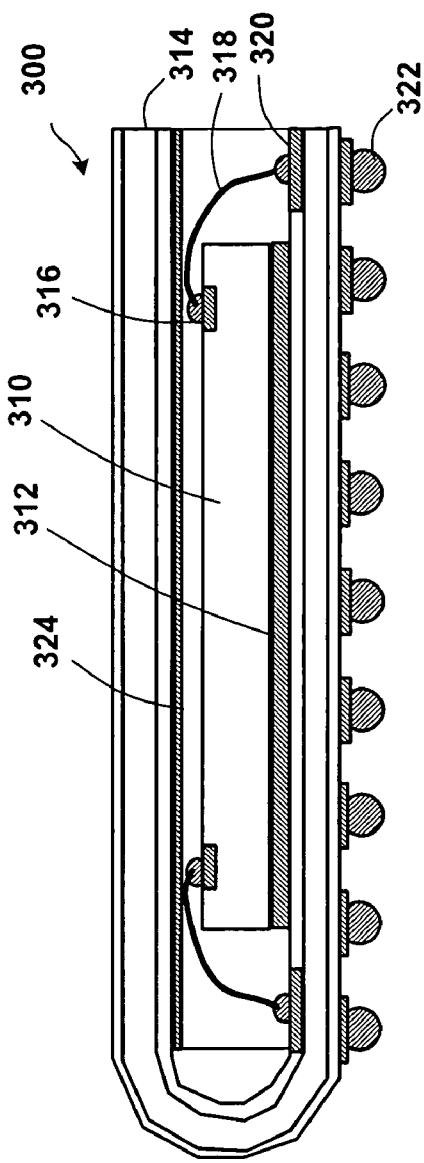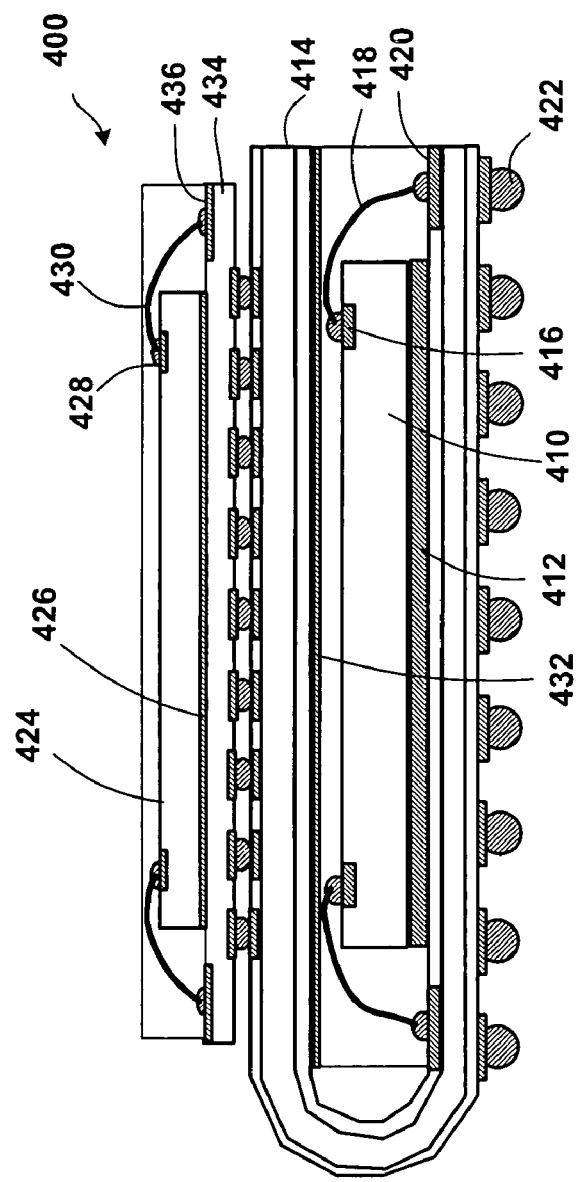

US 7,816,487 B2

DIE-ATTACH FILMS FOR CHIP-SCALE PACKAGING, PACKAGES MADE THEREWITH, AND METHODS OF ASSEMBLING SAME

TECHNICAL FIELD

Disclosed embodiments relate to die-attach materials. More particularly, disclosed embodiments relate to die-attach materials in packages.

BACKGROUND INFORMATION

Film-based die-attach materials are increasingly becoming the technology of choice for die-attach applications in stacked chip scale packages. The die-attach film has the ability to overcome warpage that can occur with a thinned die. The use of film-based die-attach, however creates unique challenges as it becomes increasingly difficult to form void free interfaces between the film, the substrate, and the die.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which:

FIG. 1 is a cross-section of a package including a die-attach composition according to an embodiment;

FIG. 2 is a cross-section of a package including a die-attach composition and an additional die according to an embodiment;

FIG. 3 is a cross-section of a package including a die-attach composition and a folded-flex substrate according to an embodiment;

FIG. 4 is a cross-section of a package including a die-attach composition, a folded-flex substrate, an additional die disposed upon the folded-flex substrate, and an additional die-attach composition according to an embodiment;

DETAILED DESCRIPTION

Figure 5:
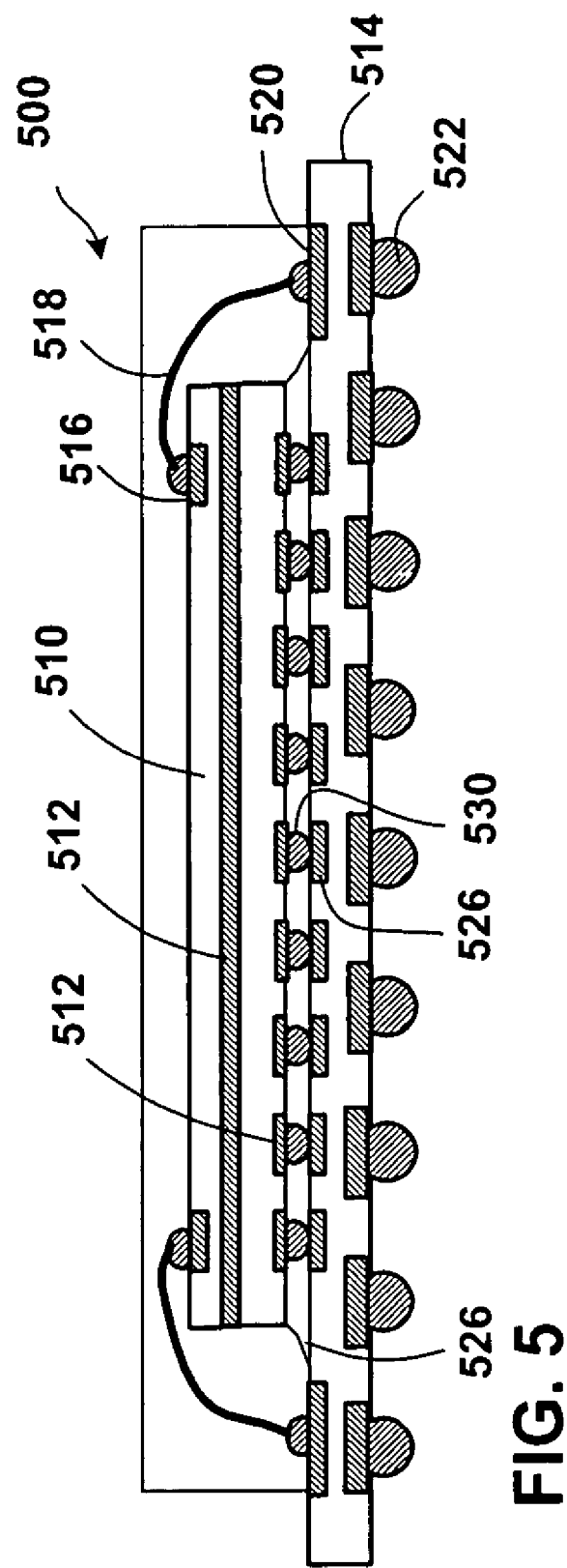
FIG. 5 is a cross-section of a package including a flip-chip disposed upon a mounting substrate, a wire-bond chip disposed upon the flip-chip, and a die-attach composition disposed therebetween according to an embodiment.

The following description includes terms, such as upper, lower, first, second, etc., that are used for descriptive purposes only and are not to be construed as limiting. The embodiments of a device or article described herein can be manufactured, used, or shipped in a number of positions and orientations.

The terms "die" and "processor" generally refer to the physical object that is the basic workpiece that is transformed by various process operations into the desired integrated circuit device. A die is usually singulated from a wafer, and wafers may be made of semiconducting, non-semiconducting, or combinations of semiconducting and non-semiconducting materials.

A board is typically a resin-impregnated fiberglass structure that acts as a mounting substrate for the die. A board can be prepared with a bond pad, also referred to as a bond finger, that is flush with the board, or the bond pad can be set upon the board surface. As depicted in this disclosure, a bond pad is not limited to being flush or being set upon the surface only because it is illustrated as such, unless it is explicitly stated in the text.

A "solder bump" or "electrical bump" is understood to be a unit of electrically conductive material such as a tin-lead solder, a tin-indium solder, a tin-bismuth solder, a tin-silver solder, or other solders that are used in the microelectronic arts. The terms "solder bump" and "electrical bump" can be used interchangeably. Additionally, other electrical communication structures can be used, such as a wire bonds.

In accordance with disclosed embodiments, a reactive diluent is added to a resin and a hardener, which lowers the viscosity of the die-attach composition. A lower viscosity allows for a more complete contact bond between a die and a mounting substrate such as a heat spreader or a board.

Reference will now be made to the drawings wherein like structures will be provided with like reference designations. In order to show the structure and process embodiments most clearly, the drawings included herein are diagrammatic representations of embodiments. Thus, the actual appearance of the fabricated structures, for example in a photomicrograph, may appear different while still incorporating the essential structures of embodiments. Moreover, the drawings show only the structures necessary to understand the embodiments. The embodiment may be referred to, individually and/or collectively, herein by the term, "invention" merely for convenience and without intending to voluntarily limit the scope of this disclosure to any single invention or inventive concept if more than one is in fact disclosed. Additional structures known in the art have not been included to maintain the clarity of the drawings.

FIG. 1 is a cross-section of a package including a die-attach composition according to an embodiment. The package 100 includes a first die 110, a die-attach composition 112 according to an embodiment, and a mounting substrate 114. The first die 110 is coupled to the mounting substrate 114 through a die-bond pad 116, a bond wire 118, and a mounting substrate bond finger 120. Additionally, the package 100 may include further electrical connection such as a series of bumps, one of which is designated with reference numeral 122, for further mounting such as upon a motherboard.

In an embodiment, the mounting substrate 114 is part of a printed wiring board (PWB) such as a main board. In an embodiment, the mounting substrate 114 is part of an interposer. In an embodiment, the mounting substrate 114 is part of a mezzanine PWB. In an embodiment, the mounting substrate 114 is part of an expansion card PWB. In an embodiment, the mounting substrate 114 is part of a small PWB such as a board for a handheld device such as a cell phone or a personal digital assistant (PDA).

In an embodiment, the die-attach composition 112 includes a thermosetting resin. In an embodiment, the die-attach composition 112 includes a thermoplastic. Additionally, the die-attach composition 112 includes a diluent such as an oligomer. In an embodiment, the diluent includes a reactive polymer. In an embodiment, the diluent includes a combination of an oligomer, and a reactive polymer.

FIG. 2 is a cross-section of a package including a die-attach composition 212 and an additional die 224 according to an embodiment. The package 200 includes a first die 210, and the die-attach composition 212 that adheres the first die 210 to a mounting substrate 214. The first die 210 is coupled to the mounting substrate 214 through a die-bond pad 216, a bond wire 218, and a mounting substrate bond finger 220. Additionally, the package 200 may include further electrical connection such as a series of bumps, one of which is designated with reference numeral 222, for further mounting such as upon a motherboard.

In an embodiment, an additional die 224 is disposed above the first die 210 with an additional die-attach composition 226. Electronic communication between the additional die 224 and the mounting substrate 214 is carried out with an additional die bond pad 228, an additional die wire bond 230, and an additional die bond finger 232. The materials that make up the die-attach compositions 212, and 226 can be any of the die-attach embodiments set forth in this disclosure.

FIG. 3 is a cross-section of a package including a die-attach composition 312 and a folded-flex substrate 314 according to an embodiment. The package 300 includes a first die 310, the die-attach composition 312 according to an embodiment, and the folded-flex substrate 314. The first die 310 is coupled to the folded-flex substrate 314 through a die-bond pad 316, a bond wire 318, and a mounting substrate bond finger 320. Additionally, the package 300 may include further electrical connection such as a series of bumps, one of which is designated with reference numeral 322, for further mounting such as upon a motherboard. The folded-flex substrate 314 includes an upper adhesive 324 that bonds the folded-flex substrate 314 above the first die 310. Additionally, the first die 310 is encapsulated in an encapsulation material 326, which the upper adhesive 324 has bonded it to the folded-flex substrate 314.

Both the die-attach composition 312 and the upper adhesive 324, or one of them, is a die-attach composition according to any of the embodiments set forth in this disclosure.

FIG. 4 is a cross-section of a package 400 including a die-attach composition 412, a folded-flex substrate 414, an additional die 424 disposed upon the folded-flex substrate 414, and an additional die-attach composition 426 according to an embodiment. The package 400 includes a first die 410, the die-attach composition according to an embodiment, and the mounting substrate 414. The first die 410 is coupled to the mounting substrate 414 through a die-bond pad 416, a bond wire 418, and a mounting substrate bond finger 420. Additionally, the package 400 may include further electrical connection such as a series of bumps, one of which is designated with reference numeral 422, for further mounting such as upon a motherboard. The folded-flex substrate 414 includes an upper adhesive 432 that bonds the folded-flex substrate 414 above the first die 410.

In an embodiment, the additional die 424 is disposed above the mounting substrate 414, above the first die 410, and above the upper adhesive 432. The additional die 424 is adhered to an upper mounting substrate 434 with an additional die-attach composition 426. Electronic communication between the additional die 424 and the mounting substrate 414 is carried out through an additional die bond pad 428, an additional die bond wire 430, and an additional die bond finger 436.

The die-attach composition 412, the upper adhesive 432, and the additional die-attach composition 426, or one of them, includes a die-attach composition according to any of the embodiments set forth in this disclosure.

FIG. 5 is a cross-section of a package including a flip-chip disposed upon a mounting substrate, a wire-bond chip disposed upon the flip-chip, and a die-attach composition disposed therebetween according to an embodiment. The package 500 includes a first die 510 that is adhered with a die-attach composition 512 above a mounting substrate 514. Electronic communication between the first die 510 and the mounting substrate 514 is carried out through a first die bond pad 516, a first die bond wire 518, and a first die bond finger 520. Further electronic communication from the first die 510 through the mounting substrate 514 can be carried out through a series of bumps, one of which is designated with the reference numeral 522. The series of bumps 522 can be mounted upon a larger structure such as a motherboard. In this embodiment, the first die 510 is mounted upon a flip-chip additional die 524 such that the first die at its backside surface is adhered through the die-attach composition to the backside surface of the flip-chip additional die. In an embodiment, the flip-chip additional die 524 is stabilized with a die-attach composition 526 that is in contact with the flip-chip additional die 524 and the mounting substrate 514. Electronic communication between the flip-chip additional die is carried from a flip-chip die bond pad 528, a bump 530, and a mounting substrate bond pad 534.

In an embodiment, the die-attach composition with one of the diluent embodiments, includes a melt viscosity in a range from about 100 cp$\leq\mu\leq$10,000 cp. Further, the diluent alone exhibits a melt viscosity in a range from about 10 cp$\leq\mu\leq$5,000 cp.

Diluents

Reactive Polymers

In an embodiment, the die-attach composition includes a reactive polymer in connection with a polyimide resin and a hardener. This die-attach composition embodiment also includes the solution, reaction, and mixture products thereof including residue. In an embodiment, the reactive polymer diluent is an aliphatic amine. In an embodiment, the reactive polymer diluent is an aromatic amine. In an embodiment, the reactive polymer diluent is a phenol. In an embodiment, the reactive polymer diluent is an anhydride.

In an embodiment, the diluent includes a reactive polymer including the compound

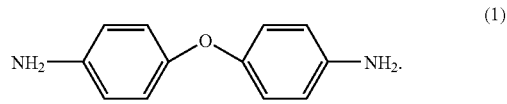

(1)

In an embodiment, the diluent includes a reactive polymer including the compound

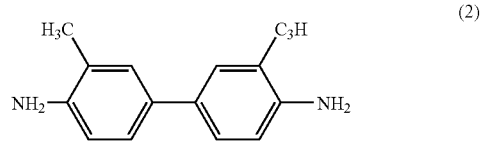

(2)

In an embodiment, the diluent includes a reactive polymer including the compound

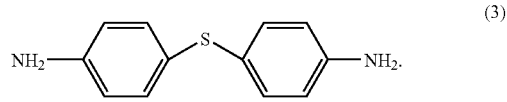

(3)

In a first example, the die-attach composition include a reactive polymer in a range from about 5% to about 10%, a resin in a range from about 50% to about 80%, and a hardener in a range from about 5% to about 15%. In this first example, the die-attach composition includes a thermoplastic resin blend of a polyimide and an epoxy or cyanate ester resin. A filler is present in a range from about 5% to about 20%, and a catalyst is present at about 1%.

In a first variation of example 1, the diluent includes the compound depicted in Equation (1), in a concentration of about 8%. A polyimide is present in a concentration of about 50%-80%. The epoxy is present in a concentration of about 12%. The hardener is present in a concentration of about 12%. The filler is present in a concentration of about 5%. And the catalyst is present in a concentration of about 1%.

In an embodiment, the die-attach composition including the compound depicted in Equation (1), is B-staged before a die is bonded thereto. In an embodiment, the die-attach composition including the compound depicted in Equation (1), is thermally cured before wirebonding. In an embodiment, the die-attach composition including the compound depicted in Equation (1), is thermally cured during curing of the encapsulation material. In an embodiment, the die-attach composition including the compound depicted in Equation (1), is thermally cured after curing of the encapsulation material.

In a second variation of example 1, the diluent includes the compound depicted in Equation (2), in a concentration of about 10%. A polyimide is present in a concentration of about 50%-80%. The epoxy is present in a concentration of about 15%. The hardener is present in a concentration of about 7%. The filler is present in a concentration of about 10%. And the catalyst is present in a concentration of about 1%.

In an embodiment, the die-attach composition including the compound depicted in Equation (2), is B-staged before a die is bonded thereto. In an embodiment, the die-attach composition including the compound depicted in Equation (2), is thermally cured during curing of the encapsulation material. In an embodiment, the die-attach composition including the compound depicted in Equation (2), is thermally cured after curing of the encapsulation material.

In a third variation of example 1, the diluent includes the compound depicted in Equation (3), in a concentration of about 7%. A polyimide is present in a concentration of about 50%-80%. The epoxy is present in a concentration of about 5%. The hardener is present in a concentration of about 10%. The filler is present in a concentration of about 5%. And the catalyst is present in a concentration of about 1%.

In an embodiment, the die-attach composition including the compound depicted in Equation (3), is B-staged before a die is bonded thereto. In an embodiment, the die-attach composition including the compound depicted in Equation (3), is thermally cured during curing of the encapsulation material. In an embodiment, the die-attach composition including the compound depicted in Equation (3), is thermally cured after curing of the encapsulation material.

Oligomers

In an embodiment, the die-attach composition includes a low molecular weight oligomer. In an embodiment, the diluent in the die-attach composition includes the compound

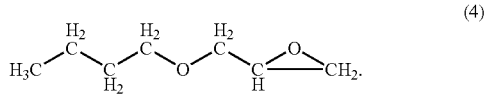

(4)

In an embodiment, the diluent in the die-attach composition includes an oligomer including

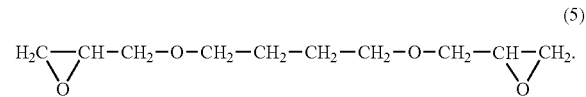

(5)

In an embodiment, the diluent in the die-attach composition includes an oligomer including

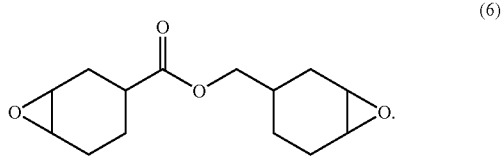

(6)

In a second example, the die-attach composition includes an oligomer in a range from about 5% to about 10%, a resin in a range from about 30% to about 50%, and a hardener in a range from about 30% to about 50%. In an embodiment, the die-attach composition that includes an oligomer diluent further includes a filler in a range from about 5% to about 25%, a catalyst in a range of about 1%, and a coupling agent, also in a range of about 1%. Additionally, the oligomer-containing die-attach composition includes a toughening agent in a range from about 5% to about 10%.

In a first variation of the second example, the die-attach composition includes an oligomer compound depicted in Equation (4), in a concentration of about 7%. The epoxy is a thermoset resin and is present in a concentration range from about 30% to about 50%. The hardener is present in a concentration of about 15%. The filler is present in a concentration of about 8%. A coupling agent is present in a concentration of about 1%. A toughening agent is present in a concentration of about 3%. And the catalyst is present in a concentration of about 1%.

In an embodiment, the die-attach composition including the compound depicted in Equation (4), is B-staged before a die is bonded thereto. In an embodiment, the die-attach composition including the compound depicted in Equation (4), is thermally cured during curing of the encapsulation material. In an embodiment, the die-attach composition including the compound depicted in Equation (4), is thermally cured after curing of the encapsulation material.

In a second variation of the second example, the diluent in the die-attach composition includes the compound depicted in Equation (5), in a concentration of about 10%. The epoxy is a thermoset resin and is present in a concentration range from about 30% to about 50%. The hardener is present in a concentration of about 15%. The filler is present in a concentration of about 15%. A coupling agent is present in a concentration of about 1%. A toughening agent is present in a concentration of about 10%. And the catalyst is present in a concentration of about 1%.

In an embodiment, the die-attach composition including the compound depicted in Equation (5), is B-staged before a die is bonded thereto. In an embodiment, the die-attach composition including the compound depicted in Equation (5), is thermally cured during curing of the encapsulation material. In an embodiment, the die-attach composition including the compound depicted in Equation (5), is thermally cured after curing of the encapsulation material.

In a third variation of the second example, the diluent in the die-attach composition includes an oligomer depicted in Equation (6), in a concentration of about 10%. The epoxy is a thermoset resin and is present in a concentration range from about 30% to about 50%. The hardener is present in a concentration of about 30%. The filler is present in a concentration of about 10%. A coupling agent is present in a concentration of about 1%. A toughening agent is present in a concentration of about 10%. And the catalyst is present in a concentration of about 1%.

In an embodiment, the die-attach composition including the compound depicted in Equation (6), is B-staged before a die is bonded thereto. In an embodiment, the die-attach composition including the compound depicted in Equation (6), is thermally cured during curing of the encapsulation material. In an embodiment, the die-attach composition including the compound depicted in Equation (6), is thermally cured after curing of the encapsulation material.

According to these example variations, the selected oligomers are combinable with the materials, including beside the hardener and the epoxy, the filler, the catalyst, the coupling agent, and the toughening agent.

Additive Materials

In an embodiment, additive materials are included with the die-attach compositions.

In an embodiment, an additive material is a hardener/crosslinker as set forth above. The specific hardener/crosslinker that is employed will depend upon compatibility with the die-attach composition. Hardeners/crosslinkers can be both aromatic and aliphatic in nature. The hardener/crosslinker in one embodiment is an anhydride composition. Some suitable anhydride hardeners include nadic anhydride, methyl cyclohexy anhydride, pthalic anhydride, or the like. In an embodiment, the hardener/crosslinker is an amine.

In an embodiment, the additive material is a catalyst as set forth above. The specific catalyst that is employed depends upon compatibility with the die-attach composition. Some catalysts for the above die-attach compositions according to embodiments include imidizole and its derivatives, amines, triphenylphosphine, or the like. Other suitable examples include, methylene diamine, di-aminodiphenyl sulfone, or the like.

Another additive material according to an embodiment is an adhesion promoter. The specific adhesion promoter that is employed depends upon compatibility with the die-attach composition. Adhesion promoters that can be added to the above die-attach compositions include organic and inorganic combinations. In an embodiment, a silane coupling agent or the like is used as an adhesion promoter. In an embodiment, an organo-ziconate composition or the like is used as an adhesion promoter. In an embodiment, an organo-titanate composition or the like is used as an adhesion promoter.

Another additive material according to an embodiment is a flow modifier such as a surfactant. The specific flow modifier that is employed depends upon compatibility with the die-attach composition. The surfactant requires properties such as compatibility with the die-attach composition. In an embodiment, the surfactant is anionic such as long chain alkyl carboxylic acids, such as lauric acids, steric acids, and the like. In an embodiment, the surfactant is nonionic. Examples of nonionic surfactants are polyethtlene oxides, poly propylene oxides, and the like. In an embodiment, the surfactant is cationic such as alkyl ammonium salts such as terta butyl ammonium chlorides, or hydroxides.

Another additive material according to an embodiment is a toughening agent as set forth above. A toughening agent causes the die-attach composition to resist crack propagation.

In an embodiment, an elastomer is used as the toughening agent. The specific elastomer that is employed to toughen the matrix depends upon compatibility with the die-attach composition. For example, an elastomer that is used with epoxy-functionalized compositions is carboxy-terminated polybutadiene-acrylonitrile (CTBN). CTBN is the generic name for a family of elastomer additives for epoxies, with the primary elastomer being functionalized butadine-acrylonitrile copolymer. These elastomers are available as epoxy, carboxy, amino and vinyl terminal functionalities. Other elastomers may be used that are compatible with a given die-attach composition.

Another additive material according to an embodiment is a inorganic particulate filler as set forth above. Inorganic particulate fillers that optionally are added to the die-attach mixtures include oxides of various elements such as silica, alumina, and others. Other inorganic particulate fillers include nitrides such as silicon nitride and the like. Other inorganic particulate fillers include conductive materials such as graphite, diamond, and the like. When an inorganic particulate filler is added, the die-attach mixture is more appropriately referred to as an "die-attach composite", in that it has inorganic particulate fillers as existing technology does, but it includes an die-attach composition according to various embodiments. The die-attach composite embodiments, unlike most other embodiments, include a more-than-one-phase substance.

Processing Conditions

In an embodiment, curing the die-attach composition is cured by an autocatalytic process. The autocatalytic process is carried out in an embodiment by providing the diluent in the die-attach composition. In an embodiment, the curing process is carried out by an additive catalytic curing process. The additive catalytic curing process includes an additive such as a metal catalyst powder that causes the die-attach composition to cure. In an embodiment, a cross-linking/hardening process is carried out to cure the die-attach composition. Examples of specific cross-linker/hardener compositions are set forth herein. In an embodiment, a thermoset curing process is carried out. Typically, several curing process embodiments are assisted by thermal treatment. However, in some embodiments, such as the use of an epoxy alone, thermoset processing may be done without other curing agent processes.

Figure 6:
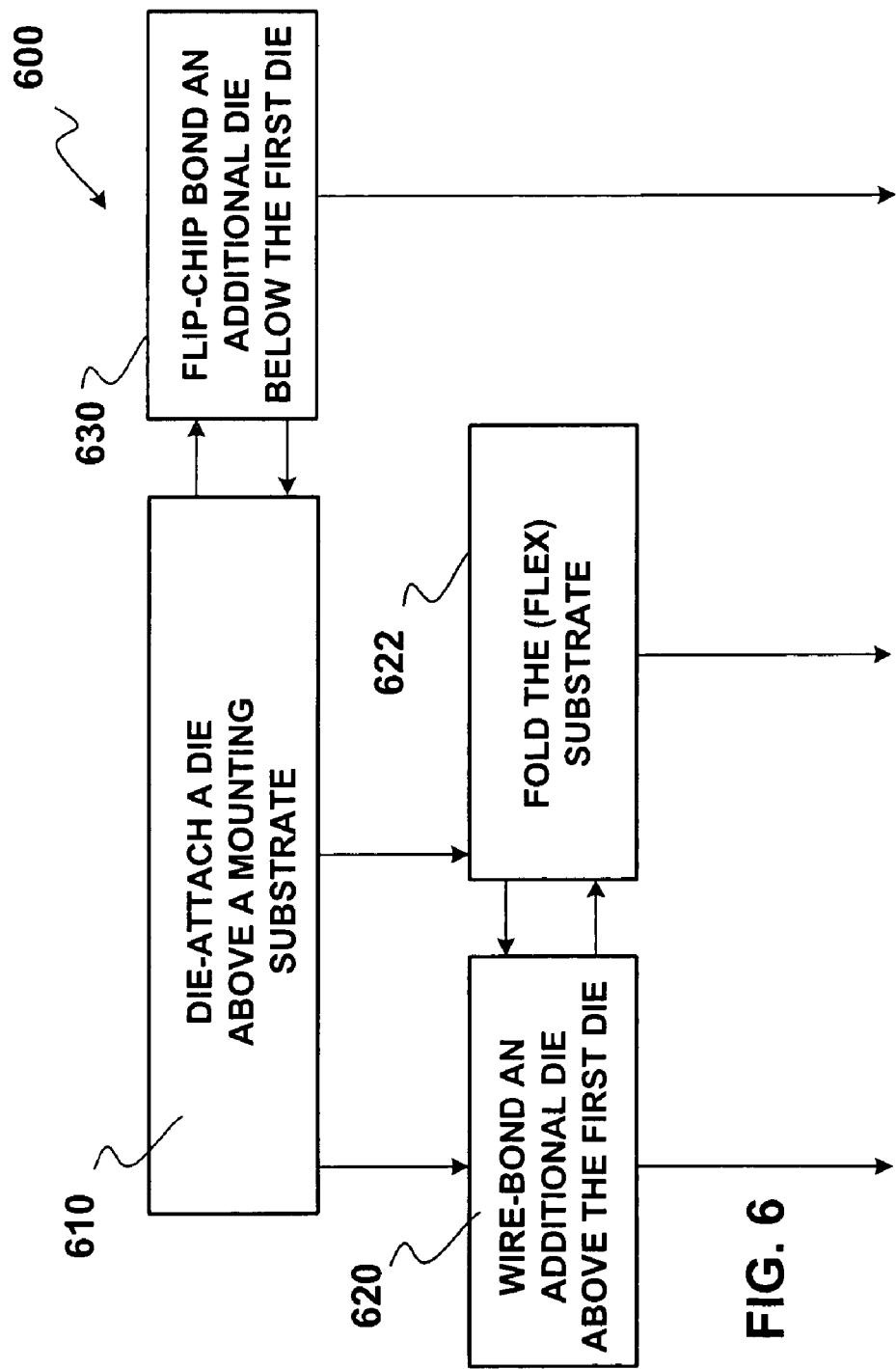
FIG. 6 is a process flow diagram according to an embodiment.

FIG. 6 is a method flow diagram according to an embodiment.

At 610, the method includes die-attach bonding a die above a mounting substrate. According to the various embodiments, the mounting substrate can be any of the die, the mounting substrate, and/or the motherboard as discussed in this disclosure. In an embodiment, the method may terminate at 610.

At 620, the method includes wire bonding an additional die above the first die. According to the various embodiments, wire bonding an additional die above the first die can include using a second die-attach composition such as the die-attach composition 226 depicted in FIG. 2. In an embodiment, the method may terminate at 620.

At 622, the method includes optionally folding the mounting substrate. According to the various embodiments, the mounting substrate can be a flex substrate that is foldable such as the folded-flex substrates depicted in FIGS. 3 and 4. In an embodiment, the method may terminate at 622.

At 630, the method includes flip-chip bonding and additional die upon the mounting substrate. According to the various embodiments, the method of flip-chip bonding an additional die upon the mounting substrate is followed by die-attaching the first die above the mounting substrate such as depicted at process 610. Accordingly, die-attaching the first die above the mounting substrate includes using a die-attach composition such as, e.g., the die-attach composition 512 that is disposed between the backside of the flip-chip die 524, and the backside of the wire-bond first die 510.

Figure 7:
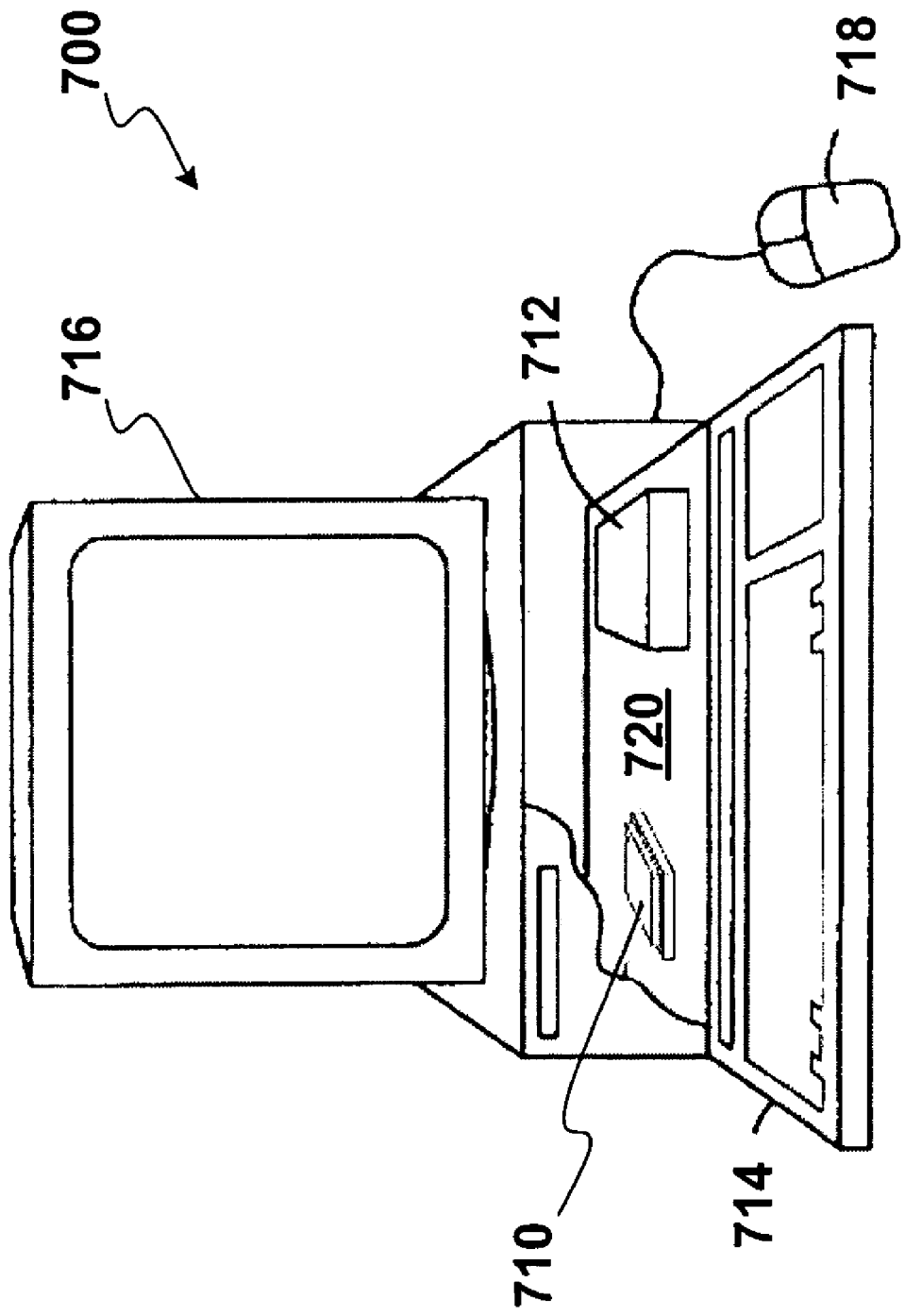
FIG. 7 is a depiction of a computing system according to an embodiment.

FIG. 7 is a depiction of a computing system 700 according to an embodiment. One or more of the foregoing embodiments of a die-attach composition and/or composite may be utilized in a computing system, such as a computing system 700 of FIG. 7. The computing system 700 includes at least one processor (not pictured), which is enclosed in a package 710, a data storage system 712, at least one input device such as keyboard 714, and at least one output device such as monitor 716, for example. The computing system 700 includes a processor that processes data signals, and may include, for example, a microprocessor, available from Intel Corporation. In addition to the keyboard 714, the computing system 700 can include another user input device such as a mouse 718, for example.

For purposes of this disclosure, a computing system 700 embodying components in accordance with the claimed subject matter may include any system that utilizes a die-attach composition and/or composite, which may be coupled to a mounting substrate 720, for example, for a data storage device such as dynamic random access memory, polymer memory, flash memory, and phase-change memory. The die-attach composition and/or composite can also be coupled to a mounting substrate 720 for a die that contains a digital signal processor (DSP), a micro-controller, an application specific integrated circuit (ASIC), or a microprocessor.

Embodiments set forth in this disclosure can be applied to devices and apparatuses other than a traditional computer. For example, a die can be packaged with an embodiment of the die-attach composition and/or composite and placed in a portable device such as a wireless communicator or a hand-held such as a personal digital assistant and the like. Another example is a die that can be packaged with a die-attach composition and/or composite and placed in a vehicle such as an automobile, a locomotive, a watercraft, an aircraft, or a spacecraft.

The Abstract is provided to comply with 37 C.F.R. §1.72(b) requiring an Abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A die-attach composition comprising:
a cyanate ester resin in a range from about 30% by weight to about 50% by weight;
a hardener in a range from about 5% by weight to about 15% by weight; and a reactive polymer diluent in a range from about 5% by weight to about 10% by weight, and wherein the diluent includes

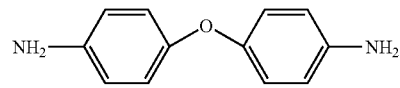

in a concentration of about 8% by weight.

2. The die-attach composition of claim 1, further including a filler in a range from about 5% by weight to about 20% by weight; and
a catalyst of about 1% by weight.

3. A die-attach composition comprising:
a cyanate ester resin in a range from about 30% by weight to about 50% by weight;
a hardener in a range from about 5% by weight to about 15% by weight; and
a reactive polymer diluent in a range from about 5% by weight to about 10% by weight, wherein the diluent includes

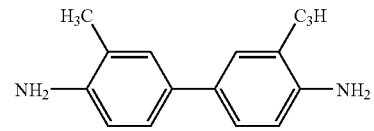

in a concentration of about 10% by weight.

4. A die-attach composition comprising:
a cyanate ester resin in a range from about 30% by weight to about 50% by weight;
a hardener in a range from about 5% by weight to about 15% by weight; and
a reactive polymer diluent in a range from about 5% by weight to about 10% by weight, wherein the diluent includes

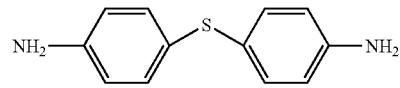

in a concentration of about 10% by weight.

5. The die-attach composition of claim 3, further including a filler in a range from about 5% by weight to about 20% by weight; and a catalyst of about 1% by weight.

6. The die-attach composition of claim 4, further including a filler in a range from about 5% by weight to about 20% by weight; and a catalyst of about 1% by weight.

* * * * *